United States Patent
Lin et al.

(10) Patent No.: US 6,753,224 B1
(45) Date of Patent: Jun. 22, 2004

(54) LAYER OF HIGH-K INTER-POLY DIELECTRIC

(75) Inventors: Yeou-Ming Lin, Jungli (TW); Tuo-Hung Hou, Chia-Yi (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 104 days.

(21) Appl. No.: 10/323,980

(22) Filed: Dec. 19, 2002

(51) Int. Cl.[7] ........................ H01L 29/80; H01L 31/112; H01L 31/0288

(52) U.S. Cl. ........................ 438/257; 438/630; 438/954

(58) Field of Search ........................ 438/257, 262–264, 438/266–267, 278, 594, 648–652, 655–656, 680–683, 685–686, 630, 954

(56) References Cited

U.S. PATENT DOCUMENTS

| | | | | |
|---|---|---|---|---|
| 5,298,447 A | * | 3/1994 | Hong | 438/257 |
| 5,923,056 A | | 7/1999 | Lee et al. | 257/192 |
| 6,008,091 A | | 12/1999 | Gregor et al. | 438/261 |
| 6,013,558 A | | 1/2000 | Wallace et al. | 438/287 |
| 6,020,243 A | | 2/2000 | Wallace et al. | 438/287 |
| 6,060,755 A | | 5/2000 | Ma et al. | 257/410 |
| 6,153,904 A | * | 11/2000 | Yang | 257/316 |
| 6,171,910 B1 | | 1/2001 | Hobbs et al. | 438/275 |
| 6,303,454 B1 | * | 10/2001 | Yeh et al. | 438/305 |

* cited by examiner

*Primary Examiner*—David Nhu
(74) *Attorney, Agent, or Firm*—George O. Saile; Stephen B. Ackerman

(57) ABSTRACT

A new Inter Poly Dielectric (IPD) layer is provided for use in creating ultra-small gate electrodes. A first and a second high-k dielectric film are provided which remain amorphous at relatively high processing temperatures. The first high-k dielectric film is of $Al_3O_5$—$ZrO_2$—$Al_3O_5$, the second high-k dielectric film is aluminum doped $ZrO_2$ or $HfO_2$.

7 Claims, 1 Drawing Sheet

US 6,753,224 B1

LAYER OF HIGH-K INTER-POLY DIELECTRIC

BACKGROUND OF THE INVENTION (1) Field of the Invention

The invention relates to the fabrication of integrated circuit devices, and more particularly, to a method of creating a high-k inter-poly dielectric for the creation of small-scale gate electrodes.

(2) Description of the Prior Art

Gate electrodes, which form the essential component of flash memory devices, are typically created using overlying layers of semiconductor material, with the lowest layer being a layer of pad oxide (also referred to as a layer of gate dielectric) and the highest layer being a layer of silicided material that serves as a low resistivity electrical contact to the gate electrode. The layers of the gate electrode are typically overlying layers of dielectric, that can consist of polysilicon, separated by a layer of Inter-Poly Dielectric (ILD).

Current technology for the creation of gate electrodes uses a silicon dioxide layer as the gate dielectric for MOS devices. With a sharp reduction in device feature size, the thickness of the layer of gate dielectric must also be reduced, for the era of device features in the sub-micron range the gate thickness is approaching 2 nanometers or less. A continued reduction of the thickness of the layer of gate dielectric leads to increasing the tunneling current through this thin layer of gate dielectric. For this reason, a thin layer of silicon dioxide (thinner than about 105 nm) cannot be used as the gate dielectric for MOS devices having sub-micron device size.

The main issues facing the creation of ever smaller flash memories center on maintaining fast programming and erase time while simultaneously reducing the operating voltage of the device, frequently resulting in a trade-off between reduced power and high operating speed. The operating voltage must be reduced with reduced device dimensions, resulting in the requirement to increase the device-coupling ratio by increasing the floating gate capacitance of the device. This leads to the requirement of reducing the thickness of the layers of Inter Poly Dielectric (IPD) or to provide layers of IPD of advantageous dielectric properties. Among the most essential of these properties is the quality of the interface between the layers of dielectric that are selected to form the IPD. This because defects in interfaces between overlying layers of dielectric can cause a reduction in the signal to noise level of the device which, in sub-micron devices where a relatively small number of charges distinguishes between data bit states, quickly leads to an unacceptable design of the gate electrode.

Prior Art methods have primarily used silicon oxide as the material of choice for the creation of a layer of IPD, this in part because a layer of silicon oxide can be grown from an underlying layer of polysilicon. It has thereby long been recognized that grown layers of silicon oxide contain fewer defects (such as pinholes) than deposited layers of material.

From the above it is clear that efforts to reduce flash memory cell dimensions must focus not only on providing suitable materials for the creation of layers of IPD but must also provide methods whereby these layers of IPD can be properly deposited without causing interface defects. The invention addresses the first of these two aspects of creating flash memory cells by providing a novel high-k layer of Inter Poly Dielectric (IPD).

U.S. Pat. No. 5,923,056 (Lee et al.) shows an Al doped Zr dielectric layer.

U.S. Pat. No. 6,060,755 (Ma et al.) shows an Al doped Zr dielectric.

U.S. Pat. No. 6,008,091 (Gregor et al.) reveals a $SiO_2$—$TaO_5$—$SiO_2$ dielectric layer.

U.S. Pat. No. 6,171,910 (Hobbs et al.) and U.S. Pat. No. 6,020,243 (Wallace et al.) are related patents.

SUMMARY OF THE INVENTION

A principle objective of the invention is to provide a high-k dielectric layer for use as an Inter Poly Dielectric (IPD) layer.

Another objective of the invention is to provide a gate dielectric that allows for reduced programming voltage of Electrically Erasable and Programmable Read Only Memory (EEPROM) devices.

Another objective of the invention is to provide a gate dielectric that allows for reduced programming time of Electrically Erasable and Programmable Read Only Memory (EEPROM) devices.

A still further objective of the invention is to provide a high-k dielectric layer for use as an Inter Poly Dielectric (IPD) layer of superior thermal stability.

In accordance with the objectives of the invention a new Inter Poly Dielectric (IPD) layer is provided for use in creating ultra-small gate electrodes. A first and a second high-k dielectric film are provided which remain amorphous at relatively high processing temperatures. The first high-k dielectric film is of $Al_3O_5$—$ZrO_2$—$Al_3O_5$, the second high-k dielectric film is aluminum doped $ZrO_2$ or $HfO_2$.

DESCRIPTION OF THE PREFERRED EMBODIMENTS

Figure 1:
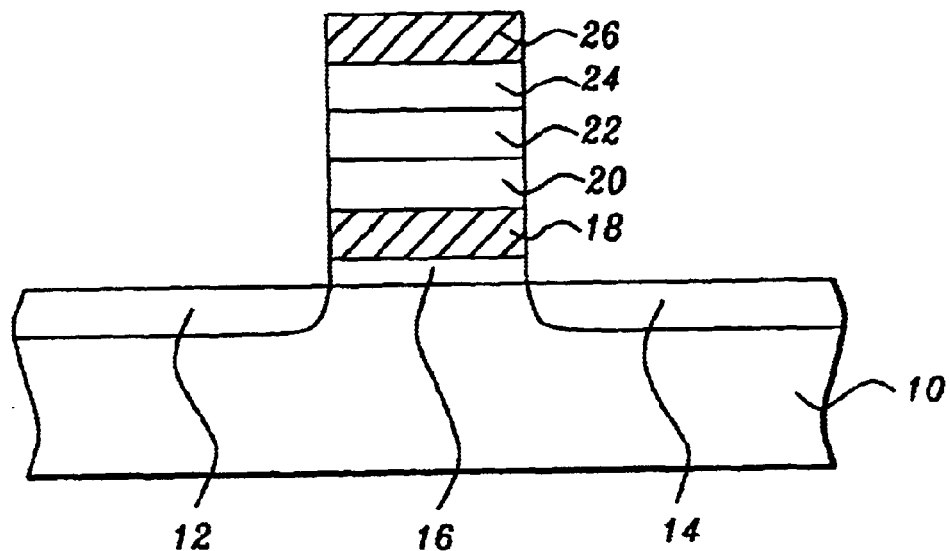
FIG. 1 shows a cross section of the layer of ILD as created under the first embodiment of the invention.

Electrically Programmable Read Only Memory (EPROM) cells are capable of being electrically programmed. EPROM cells may or may not be capable of being electrically erased. Electrically erasable and electrically programmable read-only memory (EEPROM) cells are a special type of EPROM cells. Flash EEPROM cells are specific types of both EPROM and EEPROM cells. Flash EEPROM cells are configured such that a plurality of the cells may be erased during a single erasing operation. In many devices, a row of memory cells, a column of memory cells or even the entire memory array may be erased during the same erasing operation. EEPROM cells that are not flash EEPROM's can be referred to as individual erasable EEPROM or IEEPROM's.

In order to reduce the programming voltage and the programming time of EEPROM devices, the IPD coupling capacitance can be increased by reducing the effective dielectric thickness of the IPD layer. However, decreasing the thickness of for instance a layer of ONO, that is used as layer of IPD of a gate electrode, significantly increases the leakage current through this layer. This results in poor data retention of the memory device that is created using the (reduced thickness) layer of ONO as an IPD layer. One of the materials that has been mentioned for the use of a layer of IPD is titanium oxide ($Ta_2O_5$). Since $Ta_2O_5$ has a high dielectric constant, it may be expected that $Ta_2O_5$ provides benefits in allowing a reduction in the thickness of the layer of ILD and thus in improving programming performance, due to its high dielectric constant. It is known in the art that the higher the dielectric constant of a layer of material, the lower the barrier height of this layer, which is critical to assuring low leakage current across the layer. $Al_3O_3$ has a relatively high dielectric constant of 8.5, this is still below a desired value. However, a high-k dielectric layer comprising aluminum (such as $Al_3O_5$) or a layer of $ZrO_2$, which is doped by impurity implantation, provides improved thermal stability over comparable, high-k layers which have not been provided with an impurity implantation.

The requirements that must be met by a layer of IPD for the application of such a layer in the creation of flash memory cells can be summarized as follows:

must provide a high coupling ratio of the floating gate capacitance, this to shorten programming and erase times and to reduce required operating voltages must have low leakage current, this to guarantee a data retention time of at least 10 years, and must be able to withstand high temperatures processing environments so that the layer of ILD can be integrated with the manufacturing of semiconductor devices.

Previous experiments have shown that high-k dielectrics, used as a layer of ILD, provide for a high retention rate of flash memory cells.

A layer of $Al_2O_3$ has previously been proposed to be used as the ILD of a gate electrode. This layer of $Al_2O_3$, deposited to a thickness of about 10 nm and having a dielectric constant of about 9.5, provided improved performance in erase time, voltage and leakage current when compared with conventional layers of ONO applied for the ILD.

Also previously proposed (Ma et al. U.S. Pat. No. 6,060, 755) has been a layer of aluminum doped with $ZrO_2$, the doping being performed by methods of sputter or CVD. This latter approach provided for:

improved thermal stability when compared with an undoped layer of $ZrO_2$, and a thickness of the doped layer of $ZrO_2$ of about 7.5 nm, a dielectric constant value in excess of 18 has been measured for the doped layer of $ZrO_2$.

$ZrO_2$ and Hafnium Oxide ($HfO_2$) have been mentioned in the literature of the art as alternate candidates for the materials of gate dielectric for future generations of gate electrodes. This is due to a higher dielectric constant and to improved thermal stability of these layers when compared with $Ta_2O_5$ and $TiO_2$. These materials are expected to be increasingly used in the manufacturing of semiconductor devices if these materials can be processed such that they can serve as a replacement material for conventional $SiO_2$ in creating a gate dielectric. The use of $ZrO_2$ and $HfO_2$ can potentially be extended for use as an inter-poly dielectric for non-volatile memory applications. The coupling ratio of the non-volatile memory can then be increased in order to reduce programming time and programming voltage, due to the thin effective dielectric thickness of the layer of ILD. A reasonable leakage level, required for data retention, can be maintained due to the (actual or physical) thickness of the layer of ILD.

The following paragraphs address the invention. A layer of $Al_2O_3$ provides a high dielectric constant (8.5), which is too low for further reduction of the effective thickness of the layer of ILD. A layer of $Al_2O_3$ however has a higher barrier height, which improves leakage current performance while $Al_2O_3$ forms an interface with silicon of good quality. We can therefore deposit a layer of $Al_2O_3$ over the silicon surface (as an intermediate layer), suppressing the interaction between the high-k material and the underlying silicon. The in this manner created layers of $Al_2O_3$—$ZrO_2$—$Al_2O_3$ or $Al_2O_3$—$HfO_2$—$Al_2O_3$ effectively provide the structure of a thinner layer of dielectric, resulting in lower leakage current, improved thermal stability and an improved interface between the layers and the underlying silicon.

Further provided by the invention are layers $ZrO_2$ and $HfO_2$ doped with aluminum, to be used as materials for the IPD. The doping of these layers is provided by applying methods of metallo-organic CVD (MO-CVD) and aluminum CVD (Al-CVD). These latter layers have been demonstrated to provide excellent thermal stability and are provided as candidates for the use as layers of IPD.

Figure 2:
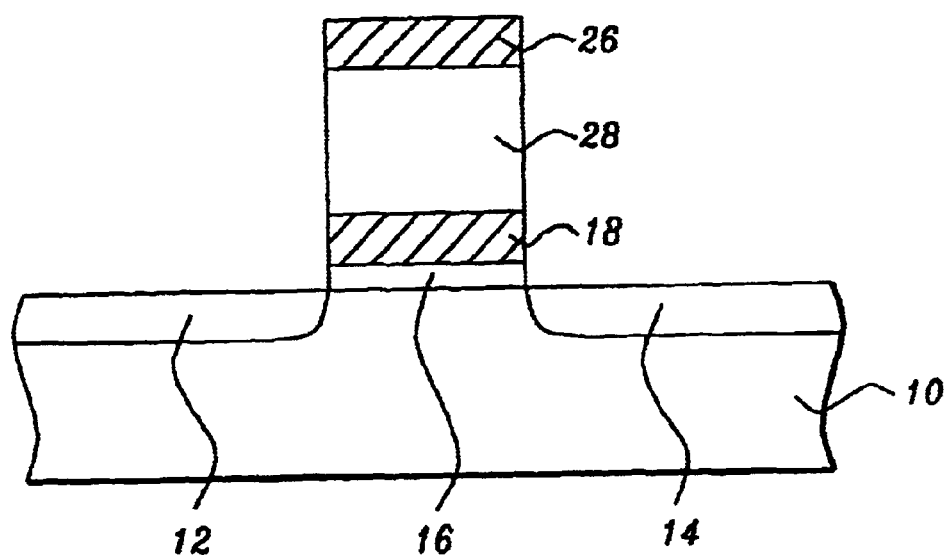
FIG. 2 shows a cross section of the layer of ILD as created under the second embodiment of the invention.

The above paragraphs, which have addressed the invention, are reflected in the cross sections that are shown in FIGS. 1 and 2, as follows:

FIG. 1 presents a first embodiment of the invention and shows a cross section of a silicon substrate over which have been created:

12, source implant for the source region of the gate electrode 14, drain implant for the drain region of the gate electrode 16, a layer of gate dielectric (pad oxide) of the gate electrode 18, the floating gate of the gate electrode 20, a layer of $Al_2O_3$, deposited over of the floating gate 18 of gate dielectric 22, a layer of $ZrO_2$, deposited over the layer 20 of $Al_2O_3$ 24, a layer of $Al_2O_3$, deposited over the layer 22 of $ZrO_2$, and 26, the control gate of the gate electrode.

The gate electrode that is created as shown in cross section in FIG. 1 provides the following advantages:

the processing steps are compatible with the creation of expected (future) gate electrode structures a layers 20/22/24 of ILD provide a higher k value when compared with pure $Al_2O_3$ layer 20 of $Al_2O_3$ provides a good interface with the underlying silicon 10 layer 20 of $Al_2O_3$ provides improved thermal stability of layer 22 of $ZrO_2$ overlying the silicon 10 layers 20 and 22 of $Al_2O_3$ provide high barrier height, improving current leakage performance of the gate electrode layer 22 of $ZrO_2$ provides for increased thickness of the combined layers 20, 22 and 24, improving current leakage performance of the gate electrode.

FIG. 2 presents a second embodiment of the invention and shows a cross section of a silicon substrate 10 over the surface of which have been created:

12, source implant for the source region of the gate electrode 14, drain implant for the drain region of the gate electrode 16, a layer of gate dielectric (pad oxide) of the gate electrode 18, the floating gate of the gate electrode 28, a layer that comprises either: 1) a layer of $ZrO_2$, doped with aluminum or 2) a layer of $HfO_2$, doped with aluminum, and 26, the control gate of the gate electrode.

The gate electrode that is created as shown in cross section in FIG. 2 provides the following advantages:

the processing steps are compatible with the creation of expected (future) gate electrode constructs layers 28 of aluminum doped $ZrO_2$ or HfO provide a higher k value when compared with pure $Al_2O_3$, and layer 28 of aluminum doped $ZrO_2$ provides improved thermal stability when overlying the silicon 10 as compared with a layer of undoped $ZrO_2$.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a layer of Inter-Poly Dielectric for use in flash memory devices, comprising the steps of:

providing a silicon substrate, an active surface area having been defined in the surface of said substrate, said active surface area being designated as being the surface area of the substrate over which at least one gate structure is to be created, said gate structure forming a gate structure for a flash memory device;

depositing a layer of gate dielectric over the surface of the substrate;

depositing a layer of floating gate material over the surface of the layer of gate dielectric;

depositing a composite layer of Inter-Poly Dielectric over the surface of the layer of floating gate material;

depositing a layer of control gate material over the surface of the layer of gate dielectric;

patterning said layer of control gate material, said composite layer of Inter-Poly Dielectric, said layer of floating gate material and said layer of gate dielectric; and forming source and drain regions in the surface of said substrate, self-aligned with said patterned layers of control gate material, of Inter-Poly Dielectric, of floating gate material and of gate dielectric.

2. The method of claim 1 wherein said layer of Inter-Poly Dielectric comprises:

a first layer of $Al_2O_3$ deposited over the surface of said layer of floating gate material;

a layer of $ZrO_2$ deposited over the surface of said first layer of $Al_2O_3$; and a second layer of $Al_2O_3$ deposited over the surface of said layer of $ZrO_2$.

3. The method of claim 1 wherein said layer of Inter-Poly Dielectric comprises a layer of $ZrO_2$, doped with aluminum, deposited over the surface of said layer of floating gate material.

4. The method of claim 1 wherein said layer of Inter-Poly Dielectric comprises a layer of $HfO_2$, doped with aluminum, deposited over the surface of said layer of floating gate material.

5. A method of creating a layer of Inter-Poly Dielectric for use in flash memory devices, comprising the steps of:

providing a silicon substrate, an active surface area having been defined in the surface of said substrate, said active surface area being designated as being the surface area of the substrate over which at least one gate structure is to be created, said gate structure forming a gate structure for a flash memory device;

depositing a layer of gate dielectric over the surface of the substrate;

depositing a layer of floating gate material over the surface of the layer of gate dielectric;

depositing a first layer of $Al_2O_3$ over the surface of said layer of floating gate material; then depositing a layer of $ZrO_2$ over the surface of said first layer of $Al_2O_3$; then depositing a second layer of $Al_2O_3$ over the surface of said layer of $ZrO_2$; then depositing a layer of control gate material over the surface of the second layer of $Al_2O_3$;

patterning said layer of control gate material, said second layer of $Al_2O_3$, said layer of $ZrO_2$, said first layer of $Al_2O_3$, said layer of floating gate material and said layer of gate dielectric; and forming source and drain regions in the surface of said substrate, self-aligned with said patterned layers of control gate material, said second layer of $Al_2O_3$, said layer of $ZrO_2$, said first layer of $Al_2O_3$, said layer of floating gate material and said layer of gate dielectric.

6. A method of creating a layer of Inter-Poly Dielectric for use in flash memory devices, comprising the steps of:

providing a silicon substrate, an active surface area having been defined in the surface of said substrate, said active surface area being designated as being the surface area of the substrate over which at least one gate structure is to be created, said gate structure forming a gate structure for a flash memory device;

depositing a layer of gate dielectric over the surface of the substrate;

depositing a layer of floating gate material over the surface of the layer of gate dielectric;

depositing a layer of $ZrO_2$, doped with aluminum, over the surface of said layer of floating gate material;

depositing a layer of control gate material over the surface of the layer of $ZrO_2$;

patterning said layer of control gate material, said layer of $ZrO_2$, doped with aluminum, said layer of floating gate material and said layer of gate dielectric; and forming source and drain regions in the surface of said substrate, self-aligned with said patterned layers of control gate material, of $ZrO_2$, of floating gate material and of gate dielectric.

7. A method of creating a layer of Inter-Poly Dielectric for use in flash memory devices, comprising the steps of:

providing a silicon substrate, an active surface area having been defined in the surface of said substrate, said active surface area being designated as being the surface area of the substrate over which at least on gate structure is to be created, said gate structure forming a gate structure for a flash memory device;

depositing a layer of gate dielectric over the surface of the substrate;

depositing a layer of floating gate material over the surface of the layer of gate dielectric;

depositing a layer of $HfO_2$, doped with aluminum, over the surface of said layer of floating gate material;

depositing a layer of control gate material over the surface of the layer of $HfO_2$;

patterning said layer of control gate material, said composite layer of $HfO_2$, said layer of floating gate material and said layer of gate dielectric; and forming source and drain regions in the surface of said substrate, self-aligned with said patterned layers of control gate material, of $HfO_2$, of floating gate material and of gate dielectric.

\* \* \* \* \*